(12) United States Patent
Yoshitani

(10) Patent No.: US 7,078,789 B2
(45) Date of Patent: Jul. 18, 2006

(54) METHOD OF FORMING A METAL FILM, SEMICONDUCTOR DEVICE AND WIRING BOARD

(75) Inventor: Masaaki Yoshitani, Nagano (JP)

(73) Assignee: Shinko Electric Industries Co., Ltd., Nagano (JP)

(*) Notice: Subject to any disclaimer, the term of this patent is extended or adjusted under 35 U.S.C. 154(b) by 0 days.

(21) Appl. No.: 10/732,259

(22) Filed: Dec. 11, 2003

(65) Prior Publication Data
US 2004/0121595 A1    Jun. 24, 2004

(30) Foreign Application Priority Data
Dec. 12, 2002    (JP)    ............... 2002-360686

(51) Int. Cl.
*H01L 21/31*    (2006.01)
(52) U.S. Cl. .................................... 257/678
(58) Field of Classification Search ............ 438/678
See application file for complete search history.

(56) References Cited

U.S. PATENT DOCUMENTS 5,989,653 A * 11/1999 Chen et al. .......... 427/553
6,560,863 B1    5/2003 Koyama et al.
2003/0049913 A1 * 3/2003 Gaku et al. ............. 438/411

FOREIGN PATENT DOCUMENTS

| JP | 6-87964 | 3/1994 |
|---|---|---|
| JP | 8-253869 | 10/1996 |
| JP | 10-88361 | 4/1998 |
| JP | 10-310873 | 11/1998 |
| JP | 2002-57456 | 2/2002 |

* cited by examiner

*Primary Examiner*—Thao P. Le
(74) *Attorney, Agent, or Firm*—Staas & Halsey LLP

(57) ABSTRACT

A method of forming a metal film on the surface of a resin substrate by forming plating nuclei on a resin substrate through a step of catalyzing treatment, a step of accelerating treatment and, then, a step of electrolytic copper plating treatment. Ultraviolet light is irradiated when there exist, in a mixed manner, portions exposing the surface of the resin substrate and the metal copper film formed by the electroless copper plating, to enhance the adhesion between the surface of the resin and the metal copper film. A step of ultraviolet light irradiation treatment is conducted after a step of electroless copper plating treatment. This is followed by an additional step of electroless copper plating treatment.

4 Claims, 5 Drawing Sheets

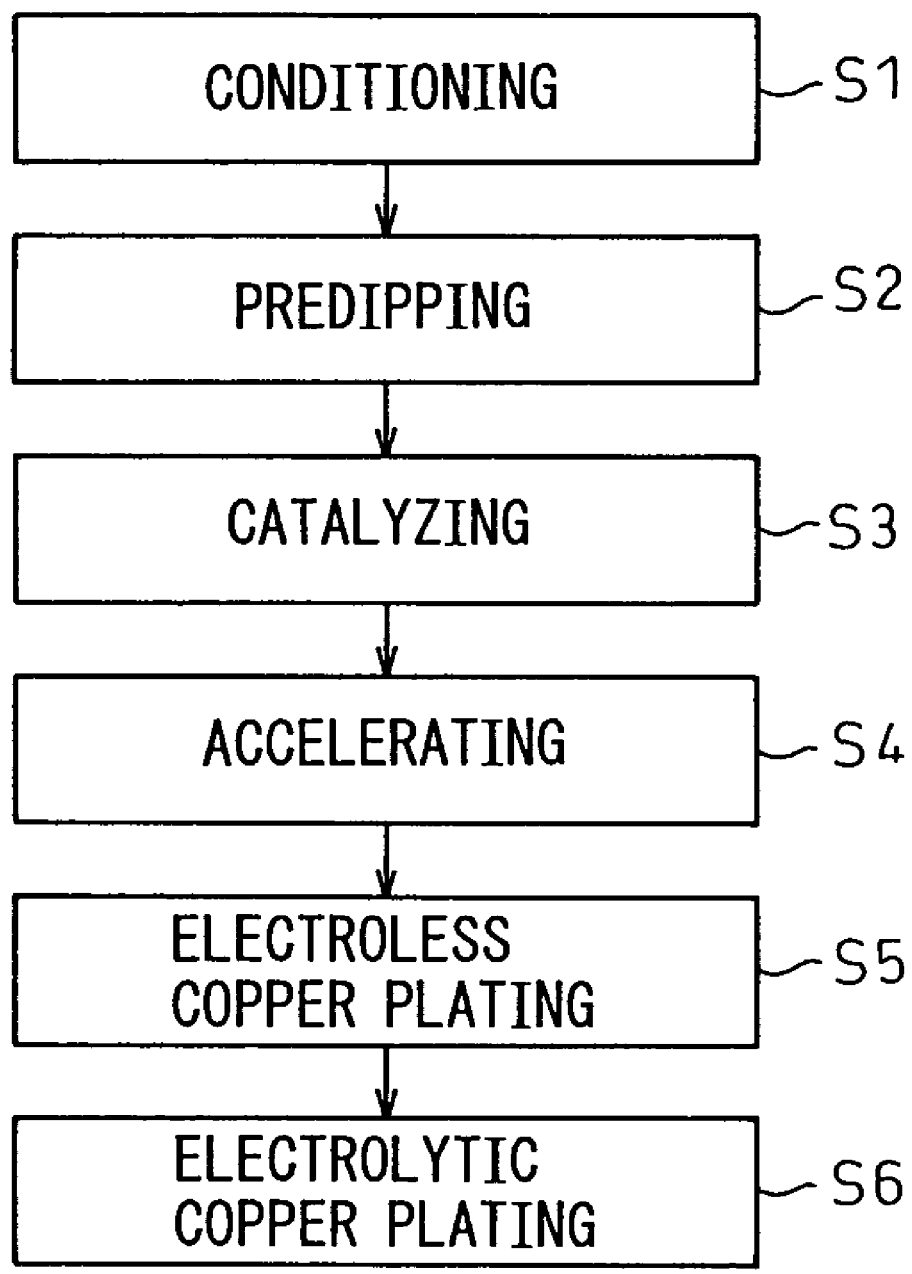

METHOD OF FORMING A METAL FILM, SEMICONDUCTOR DEVICE AND WIRING BOARD

BACKGROUND OF THE INVENTION

1. Field of the Invention

The present invention relates to a method of forming a metal film on a resin substrate, to a semiconductor device having a metal film formed on an insulating resin layer and to a wiring substrate. More particularly, the invention relates to a method of forming a metal film which is formed by plating on the surface of the resin substrate while maintaining an increased adhering force, to a semiconductor device and to a wiring board.

2. Description of the Related Art

Conventional methods of forming a metal film have been applied to, for example, build-up substrates, wiring boards inclusive of a semiconductor package using the above substrate and to semiconductor devices called chip-size packages forming a wiring pattern on a semiconductor element via an insulating resin layer.

When, for example, a wiring pattern is formed on a semiconductor device, a wiring layer is laminated between the insulating resin layers. To form the wiring layer interposed between the insulating resin layers, as described above, a substrate having electric insulation such as of polyimide or epoxy resin is used as an underlying member, a coating is applied thereon or an electrically insulating resin film is adhered thereon with pressure to form an insulating resin layer and, then, an electrically conducting layer is formed by plating or the like on the surface of the insulating resin layer. The electrically conducting layer formed on the surface of the insulating resin layer is formed into a predetermined pattern by etching thereby to form a wiring pattern on the surface of the insulating resin layer. Or, the insulating resin layer is masked in a predetermined pattern and, then, an electrically conducting layer is formed thereon by plating to form a wiring pattern.

When an electrically conducting layer is to be formed by plating on the surface of the insulating resin layer, however, it is a practice to effect the plating after the surface of the insulating resin layer is subjected to a roughening treatment (desmear treatment) in order to enhance the adhesion between the electrically conducting layer that is formed and the insulating resin layer as taught in, for example, Japanese Unexamined Patent Publication (Kokai) No. 2002-57456. The desmear treatment is conducted by etching the surface of the insulating resin layer by using an etching solution such as potassium permanganate or sodium permanganate.

In this case, the conductor is filled in the recessed portions in the surface of the insulating resin layer that is formed rough as the surface of the insulating resin layer is subjected to the desmear treatment by using an etching solution; i.e., the conductor of the wiring pattern is intimately adhered to the insulating resin layer due to the anchoring action. As the surface of the insulating resin layer becomes increasingly rough, however, precision of the pattern is affected by the roughness of the surface at the time of forming the wiring pattern by etching the conducting layer, causing a problem in that it becomes difficult to precisely form very fine wiring patterns.

In forming the wiring pattern by etching the conducting layer depending upon the degree of roughness of the surface of the insulating resin layer, the biting amount increases with an increase in the roughness of the surface of the insulating resin layer, and the biting amount decreases with a decrease in the roughness of the surface. That is, when the surface of the insulating resin layer is very rough, the etching solution easily inters onto the side surfaces of the wiring pattern through the rough portions at the time of forming the wiring pattern by etching the conducting layer, and the side surfaces of the wiring pattern assume a floating state. When the surface is very rough, therefore, it becomes difficult to finely form the wiring pattern.

When the surface of the insulating resin layer becomes increasingly rough, further, there occurs a problem of an increase in the transmission loss of high-frequency signals. The transmission loss decreases with a decrease in the roughness of the surface. As the surface roughness of the insulating resin layer increases, further, the resistance against migration decreases. It is therefore desired that the surface roughness of the insulating resin layer on which the conducting layer is formed is as small as possible. In forming the conducting layer on the insulating resin layer, therefore, it is desired to decrease the surface roughness of the insulating resin layer as much as possible and to improve the adhesion between the insulating resin layer and the conducting layer.

When the conducting layer is to be formed on the insulating resin layer in the semiconductor devices, in general, a metal film is formed, for example, by the electroless copper plating and by the subsequent electrolytic copper plating to thereby form a wiring substrate. The copper plating, however, adheres less to the resin substrate than to the nickel plating. When a metal film that serves as a conducting layer is to be formed by the copper plating, therefore, a further reliable adhesion is required between the metal film and the resin substrate.

In order to improve the adhesion, therefore, there have been proposed a variety of methods of reforming the surface of the resin substrate and, then, effecting the electroless plating on the surface thereof as taught in, for example, Japanese Unexamined Patent Publication (Kokai) No. 6-87964. For example, the surface of the resin substrate is irradiated by an ultraviolet light laser, the resin substrate being placed in an atmosphere of an amine compound gas or an amide compound gas, and, then, the electroless plating is effected.

As the pretreatment for effecting the electroless plating onto the resin substrate, there have further been proposed a method of irradiating the surface of the resin substrate with ultraviolet light and, then, effecting the electroless plating on the surface of the resin substrate as taught in, for example, Japanese Unexamined Patent Publication (Kokai) No. 8-253869, and a method of improving the adhesion by conducting a step of surface treatment by bringing the surface into contact with an alkali solution containing a non-ionic surfactant having a polyoxyethylene bond as taught in, for example, Japanese Unexamined Patent Publication (Kokai) No. 10-88361.

There has further been proposed a method of improving the adhesion of the metal film formed on the resin substrate by electroless plating by reforming the surface of the resin substrate by irradiation with ultraviolet light so as to absorb a silane coupling agent having an amino functional group and by promoting the imparting of a tin-palladium catalyst as taught in, for example, Japanese Unexamined Patent Publication (Kokai) No. 10-310873.

In addition to the method of reforming the surface of the resin substrate by irradiation with ultraviolet light, there has further been proposed a method of improving the adhesion by treating the surface of the resin substrate with a plasma and with ultraviolet light in this order, effecting the electroless plating to form a functional group that produces the adhesion to the metal film formed by the electroless copper plating, and decreasing the surface roughness of the resin substrate, as taught in the Japanese Unexamined Patent Publication (Kokai) No. 2002-57456 described above.

When a metal film that serves as a conducting layer is to be formed on a resin substrate which is an insulating resin layer used for a semiconductor device, there have been proposed a variety of methods of improving the adhesion between the resin substrate and the metal film in order to increase the peeling strength that represents the adhesion to a practicable level.

However, the above methods are based on a prerequisite of desmearing the surface of the resin substrate by etching. The etching treatment is generally conducted by immersing the resin substrate in a strongly acidic etching solution such as a mixed solution of chromic acid and sulfuric acid, a mixed solution of dichromic acid and sulfuric acid, chloric acid, or a mixed solution of sulfuric acid and perchloric acid. However, the etching solution is a chemical solution which is dangerous and is highly likely to cause a public hazard, and must be handled and drained with a sufficient degree of attention accounting for a large burden in the operation in the step of plating for forming a metal film.

According to the above methods, further, even though the adhesion can be improved between the resin substrate and the metal film, it is necessary not only to irradiate the ultraviolet light but also to prepare a treating agent for promoting the reformation of the surface of the resin substrate after the irradiation in addition to preparing the treating solutions in the ordinary steps of treatment, causing such problems as an increased number of treatment steps and an increased cost of the treatment.

In improving the surface of the resin substrate, further, when a plasma treatment is to be effected following the irradiation with ultraviolet light, it is necessary to provide a plasma treatment apparatus in addition to the ultraviolet light irradiation apparatus. Provision of the plasma treatment apparatus causes an increase in the cost of facility making it difficult to provide the products inexpensively.

SUMMARY OF THE INVENTION

It is therefore an object of the present invention to provide a method of forming a metal film capable of easily improving the adhesion between the resin substrate and the metal film by simply using a treating solution used in the conventional treating steps of forming a metal film on the surface of a resin substrate such as of a semiconductor device, and by contriving the timing for irradiating the ultraviolet light, as well as to provide a semiconductor device having, formed on the resin substrate, a metal film relying upon the above method of forming a metal film, and a circuit wiring board.

In order to solve the above problems, the present invention provides a method of forming a metal film on the surface of a resin substrate by successively conducting the treatments according to a step of forming plating nuclei, a step of electroless plating and a step of electrolytic plating, wherein in said step of electroless plating, said plating nuclei that are formed are covered with a metal formed by said electroless plating and, then, said surface is irradiated with ultraviolet light. In the step of electroless plating, further, the electroless plating is effected after the surface is irradiated with ultraviolet light. Further, the metal formed by the electroless plating is copper or nickel.

In the method of forming the metal film, further, ultraviolet light is irradiated through a glass board placed on the surface of the resin material.

The invention further provides a semiconductor device having a metal film formed on an insulating resin layer by the above method of forming the metal film, and a wiring board having a metal film formed on the resin substrate by the above method of forming the metal film.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which:

FIG. 4 is a flowchart illustrating the procedure of a processing of a method of forming a metal film, which serves as a basis of the present invention;

DESCRIPTION OF THE PREFERRED EMBODIMENTS

Figure 1:
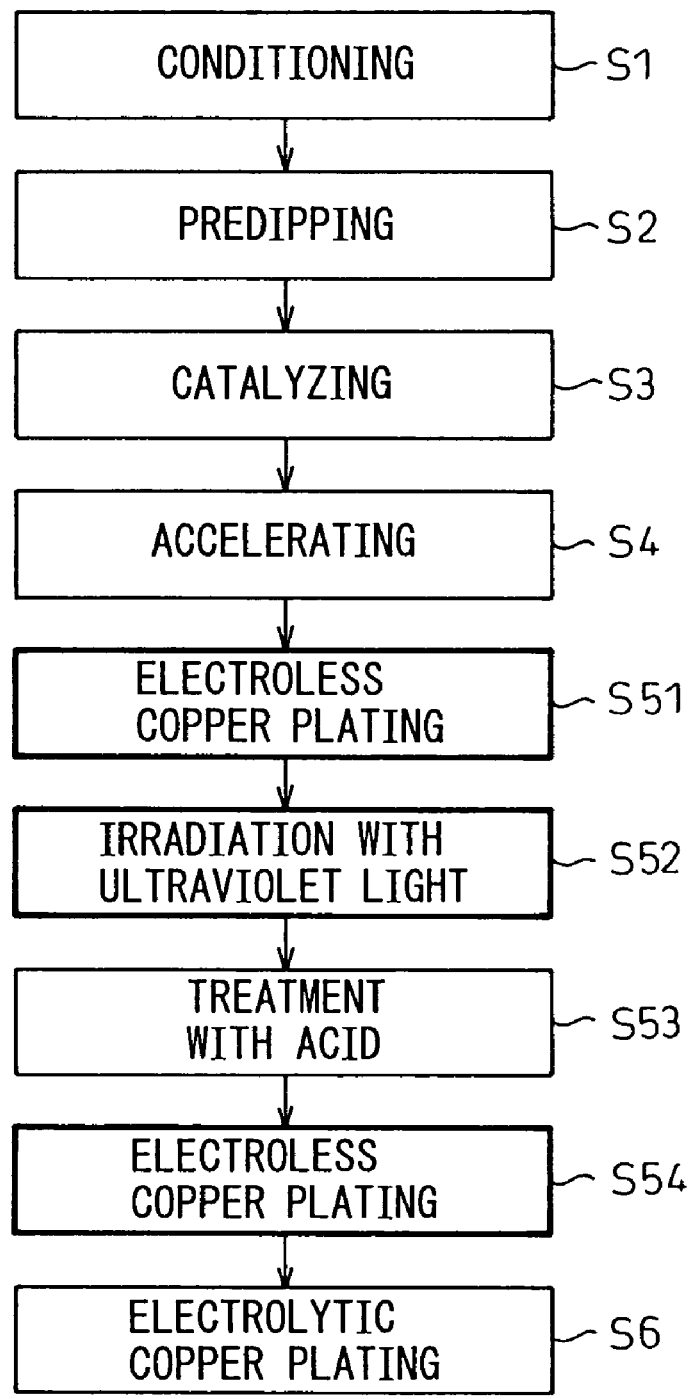
FIG. 1 is a flowchart illustrating the procedure of a processing of a method of forming a metal film according to the present invention.

Embodiments of the method of forming a metal film according to the present invention will now be described with reference to the drawings.

A plating method has heretofore been employed for forming a metal film on the surface of a resin substrate. When a metal film which is copper is to be formed on the surface of the resin substrate such as of polyimide, for example, the plating method generally comprises a step of pretreatment such as dewaxing the surface of the resin, a step of etching, a step of catalyzing, a step of accelerating, a step of electroless copper plating and a step of electrolytic copper plating.

As described above, the plating is not directly effected on the surface of the resin substrate but is effected after having executed various treatments because the resin has a hydrophobic property and it is not likely to be wetted with water. The metal film cannot be formed on the surface of the resin substrate even if the plating is directly effected on the surface. When the surface treatment is to be effected in the aqueous solution, the surface of the resin substrate must have been rendered to be hydrophilic so that it can be easily wetted with water. In order for the plated metal to be intimately adhered to the surface of the resin substrate, the surface of the resin substrate is rendered hydrophilic, the surface of the resin is activated by forming polar groups thereon, and the surface of the resin is desmeared so as to possess a roughness such as fine pores. This treatment is the etching treatment.

In order that the plating nuclei are precipitated, further, the surface of the resin must be activated with palladium (Pd) and is, hence, immersed in a catalyzing solution containing $PdCl_2$ and $SnCl_2$ so that the catalytic metal is adsorbed by the surface of the resin. This treatment is the catalyzing treatment.

Upon executing the catalyzing treatment, metal palladium that serves as plating nuclei is precipitated on the surface of the resin in the accelerating solution which contains HCl, $H_2SO_4$ or $NH_4F.HF$ in the step of accelerating treatment since a complex of Pd and Sn has been adsorbed by the surface of the resin substrate.

Then, in the step of electroless plating, metal copper is electroless-plated on the surface of the resin by the catalytic action of the plating nuclei that are precipitated on the surface of the resin, and a metal film is formed on the whole surface of the resin. The metal film formed by the electroless plating plays the role of a power feeding layer for the electrolytic plating, and is formed maintaining a thickness of, usually, about 0.5 to about 2.0 μm. Thereafter, the electrolytic copper plating is effected in the step of electrolytic copper plating treatment until a predetermined thickness that can be used for the wiring pattern is obtained, thereby to form a metal film.

The above-mentioned steps of treatments constitute a general method of forming a metal copper film on the surface of the resin substrate. Prior to carrying out the embodiment of the invention, it was attempted to conduct the treatments for forming a metal film as shown in FIG. 4 without conducting the etching treatment which involves high degree of danger and public hazard, while simplifying the steps of treatments in the method of forming the metal film.

In forming the metal film on the surface of the resin substrate as shown in FIG. 4, there are successively conducted a step S1 of conditioning treatment, a step S2 of pre-dipping treatment, a step S3 of catalyzing treatment, a step S4 of accelerating treatment, a step S5 of electroless copper plating, and a step S6 of electrolytic copper plating.

Here, the method of forming the metal film shown in FIG. 4 is different from the conventional method with respect to that the step of etching treatment is omitted, that the pre-treatment such as dewaxing of the surface of the resin substrate is conducted in the step S1 of conditioning treatment and, then, the pre-dipping treatment S2 is conducted for rendering the surface of the resin substrate to be hydrophilic and activated, followed by the step S3 of catalyzing treatment. The step S2 of pre-dipping treatment further works to promote the adsorption of a complex of Pd and Sn that serves as plating nuclei.

Figure 5A:
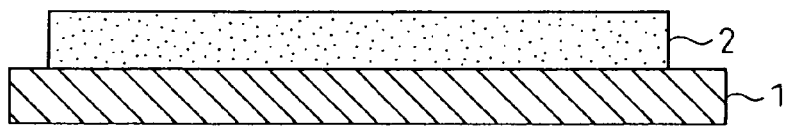
FIGS. 5A to 5E are diagrams illustrating the steps of processing of the method of forming the metal film illustrated in FIG. 4.

FIGS. 5A to 5E schematically illustrate the steps of forming a metal film according to a procedure based on the treatment steps of the method of forming the metal film illustrated in FIG. 4. FIG. 5A corresponds to the step S1 of conditioning treatment, wherein a conditioning treatment solution 2 is brought into contact with the surface of the resin substrate 1 to effect the pre-treatment for the surface of the resin on which the plating is to be conducted.

Figure 5B:
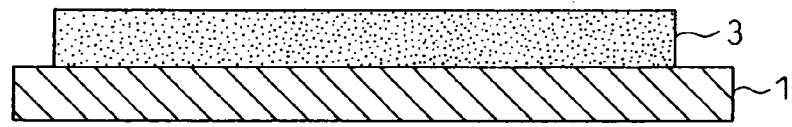

FIG. 5B corresponds to the step S2 of pre-dipping treatment, wherein a pre-dipping treatment solution 3 is brought into contact with the surface of the resin substrate 1 to put the surface to the activating treatment. In FIGS. 5A and 5B, the conditioning treatment solution 2 or the pre-dipping treatment solution 3 is placed on the surface of the resin substrate 1, which is a schematic representation by giving attention to the treatment of the surface of the resin substrate 1. In a practical step of treatment, the resin substrate is treated being immersed in each of the treatment solutions.

Figure 5C:
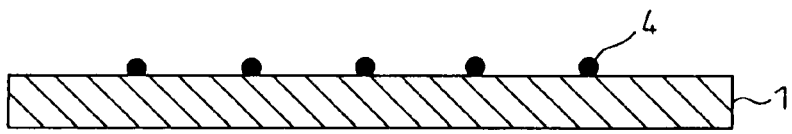

Next, FIG. 5C illustrates a state where the activation with Pd is finished on the surface of the resin substrate 1, i.e., where the step S3 of catalyzing treatment and the step S4 of accelerating treatment are conducted, and the plating nuclei 4 are precipitated. In the drawing, the plating nuclei 4 are shown by five black circles for easy comprehension on an enlarged scale. In practice, however, the plating nuclei 4 are very fine and numerous.

Figure 5D:
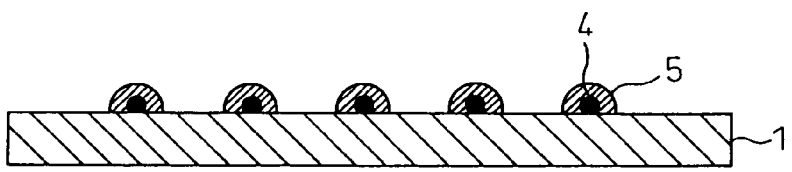

FIG. 5D corresponds to the step S5 of electroless plating treatment, wherein the electroless copper plating treatment is conducted after the plating nuclei 4 are precipitated on the surface of the resin substrate 1. Due to the catalytic action of palladium, metal copper 5 is plated on the surfaces of the plating nuclei 4. The electroless plating is further continued, and metal copper is continuously plated on the whole surface of the resin substrate 1.

Figure 5E:
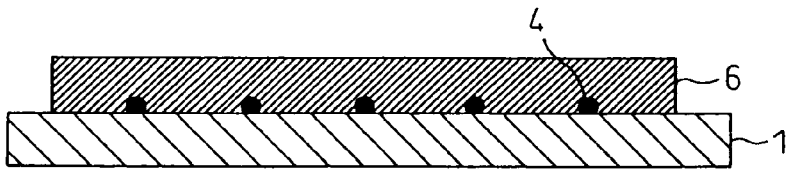

FIG. 5E corresponds to the step S6 of electrolytic copper plating treatment, wherein the electrolytic copper plating is effected after the metal copper 5 is electroless-plated on the whole surface of the resin substrate 1, thereby to form the metal film 6. Thus, the metal film that serves as a conducting layer is formed on the surface of the resin substrate 1 based on the method of forming the metal film illustrated in FIG. 4.

Figure 6:
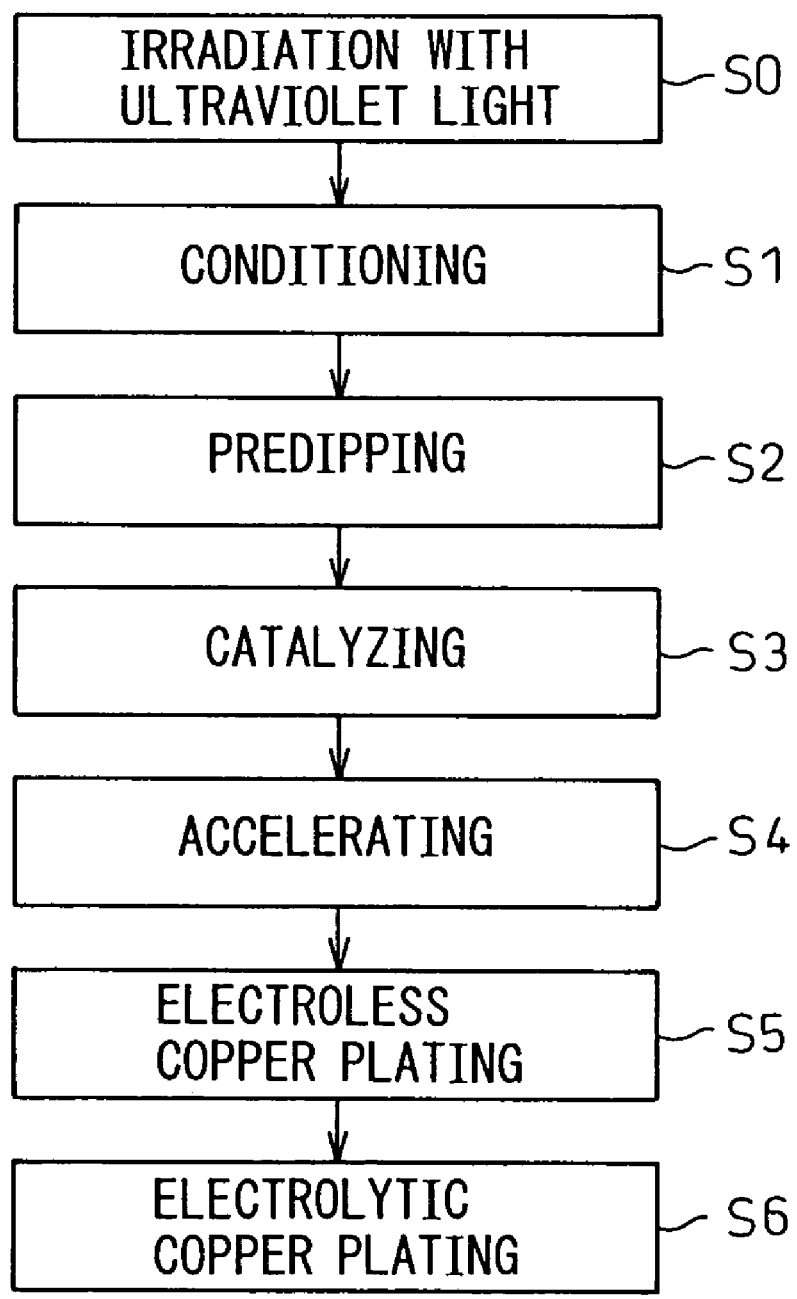
FIG. 6 is a flowchart illustrating the procedure of a processing of another method of forming a metal film, which serves as a basis of the present invention.

According to this method of forming the metal film without the step of etching treatment, however, the adhesion is weakened between the resin substrate and the metal film, and a sufficiently large peeling strength is not obtained. In order to increase the adhesion between the resin substrate and the metal film based on the method of forming a metal film, therefore, the inventors have attempted to improve the surface of the resin substrate by the irradiation with ultraviolet light. FIG. 6 illustrates a method of forming the metal film by the irradiation with ultraviolet light.

The method of forming the metal film illustrated in FIG. 6 is based on the steps of treatment of the method shown in FIG. 4, and includes the same treatment steps S1 to S6. In the method of forming the metal film of FIG. 6, a step S0 of treatment with ultraviolet light is conducted prior to the step S1 of conditioning treatment.

By irradiating the surface of the resin substrate with ultraviolet light, e.g., by using a monochromatic light of 172 nm emitted from a dielectric barrier discharge excimer lamp, it has been known that the surface of the polyimide resin can be activated. The effect of activation by the irradiation appears even when the ultraviolet light has a long wavelength. However, it has been proved that the effect of activation increases with a decrease in the wavelength (see, for example, Japanese Unexamined Patent Publication (Kokai) No. 2002-57456). However, the effect of irradiation with ultraviolet light lasts for only a short period of time, and does not last up to the activation treatment with palladium or up to the treatment of electroless copper plating. Therefore, even though the effect of activation is obtained by the irradiation with ultraviolet light, the adhesion is not improved between the resin substrate and the metal film.

In the method of forming the metal film according to this embodiment, attention is given to the fact that the adhesion between the resin substrate and the metal copper film can be improved by simultaneously irradiating the surface of the resin substrate and the copper film being electroless-plated on the surface of the resin substrate with ultraviolet light. The timing for irradiating the ultraviolet light is limited to be in a state where there are existing, in a mixed manner, a portion exposing the surface of the resin substrate and the metal copper film formed by the electroless copper plating. The adhesion is improved presumably due to that a portion where the resin substrate is contacting to the metal copper film formed by the electroless copper plating is irradiated with ultraviolet light.

In the method of forming the metal film according to the present invention, ultraviolet light is irradiated when there exist, in a mixed manner, portions exposing the surface of the resin substrate and the metal copper film formed by the electroless copper plating, thereby to improve the adhesion of the metal copper film. However, the metal copper precipitated by the electroless copper plating after the irradiation with ultraviolet light does not contribute much to improving the adhesion. Therefore, when the metal copper film formed by the electroless copper plating acquires a thickness large enough to play the role of a power feeding layer during the electrolytic copper plating, then, the additional electroless copper plating may be omitted after the irradiation with ultraviolet light. When the additional electroless copper plating is conducted on the metal copper film formed with a large thickness by the electroless copper plating, the additional electroless copper plating is called an auxiliary copper plating.

FIG. 1 illustrates the steps of treatment of a method of forming a metal film according to the embodiment of the invention. The steps of treatment of the method of forming the metal film according to this embodiment is based on the method of forming the metal film shown in FIG. 4, and the same steps are denoted by the same reference numerals. Namely, the step S1 of conditioning treatment, the step S2 of pre-dipping treatment, the step S3 of catalyzing treatment and the step S4 of accelerating treatment are the same, and are not described here again.

In the method of forming the metal film of FIG. 1, a feature resides in that an ultraviolet light irradiation treatment is inserted in a step corresponding to the step S5 of electroless copper plating treatment in the method of forming the metal film illustrated in FIG. 4. That is, the step S5 of electroless copper plating treatment is replaced by the treatment steps S51 to S54. Here, the method of forming the metal film illustrated in FIG. 1 is that of when there is included the above-mentioned additional step of electroless copper plating treatment.

First, in the step S4 of accelerating treatment, the plating nuclei 4 of palladium are precipitated on the surface of the resin substrate 1. Then, as shown in FIG. 5D, the metal copper 5 is deposited by the electroless copper plating treatment for a predetermined period of time only (step S51 of electroless copper plating treatment) with the plating nuclei 4 as a catalyst.

Figure 2:
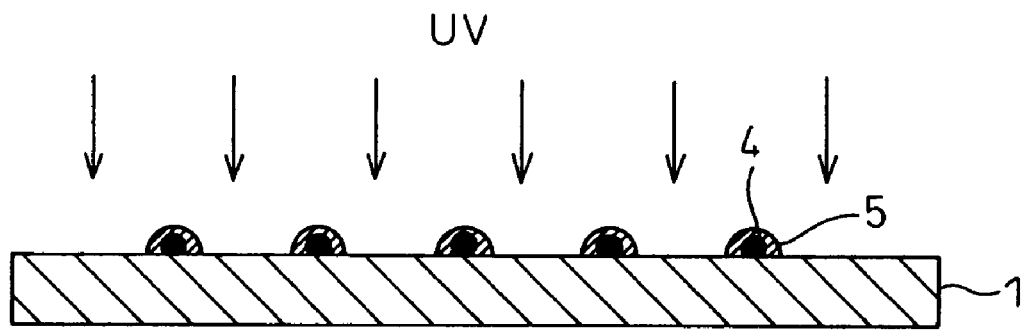
FIG. 2 is a diagram illustrating an embodiment of a method of forming a metal film by irradiating ultraviolet light while the electroless plating is being conducted.

Here, the predetermined period of time stands for interrupting the step S5 of electroless copper plating treatment during the period of from when the plating nuclei 4 are covered with the copper metal 5 by the electroless copper plating until when the surface of the resin substrate 1 is covered with the metal copper 5. Referring to FIG. 2, the electroless copper plating treatment may be discontinued in a state where the metal copper 5 is slightly deposited on the plating nuclei 4.

Referring next to FIG. 2, the whole surface is irradiated with ultraviolet light for only a predetermined period of time in a state where the metal copper 5 is deposited on the plating nuclei 4 and on part of the surface of the resin substrate 1, thereby to activate the surface of the resin substrate 1 (step S52 of ultraviolet light irradiation treatment). Then, after irradiated with the ultraviolet light, the surface of the deposited metal copper 5 is washed by using, for example, an acidic treatment solution containing dilute sulfuric acid (step S53 of treatment with acid). The treatment with acid may be omitted if the surface of the metal copper 5 does not cause any hindrance for the subsequent electroless copper plating treatment.

After the treatment with acid, the additional electroless copper plating treatment is effected until the film of metal copper 5 assumes a required thickness (step S54 of electroless copper plating treatment). This electroless copper plating treatment corresponds to the remainder of the electroless copper plating treatment that was interrupted in the step S5 of the electroless copper plating treatment shown in FIG. 4.

After the step S51 of electroless plating treatment described above, if a state where there exist, in a mixed manner, portions exposing the surface of the resin substrate and the metal copper film formed by the electroless plating, can be converted into a plating thickness in a range of, for example, 0.005 to 0.08 μm, then, the plating having a thickness of not smaller than, for example, 0.02 μm is capable of playing the role of the power feeding layer in the electrolytic copper plating. When the plating has the above thickness, therefore, the additional step of electroless copper plating treatment need not be effected after the irradiation with ultraviolet light.

Here, as the metal copper 5 is deposited maintaining a required thickness on the whole surface of the resin substrate 1, a metal copper film 6 is formed on the surface of the metal copper 5 by the electrolytic copper plating treatment (step S6 of electrolytic copper plating treatment).

As described above, ultraviolet light is irradiated at a timing of when there exist, in a mixed manner, portions exposing the surface of the resin substrate and the metal copper film formed by the electroless copper plating and, hence, the adhesion is improved between the metal copper film covering the plating nuclei and the surface of the resin. Accordingly, the adhesion is improved between the resin substrate and the conducting layer which is the wiring pattern of the metal copper film formed on the resin substrate. Besides, upon simply contriving the timing for irradiating ultraviolet light, it is made possible to use a variety of treatment solutions in various steps of treatment conducted so far by the method of forming a metal film on the surface of the resin substrate, without the need of providing any particular treatment.

In the embodiment of the method of forming the metal film shown in FIG. 1, copper was used as the metal to be electroless-plated. It is, however, also allowable to use nickel in place of copper. Even in this case, there is no change in the procedure with the exception of replacing the electroless plating treatment solution.

Figure 3:
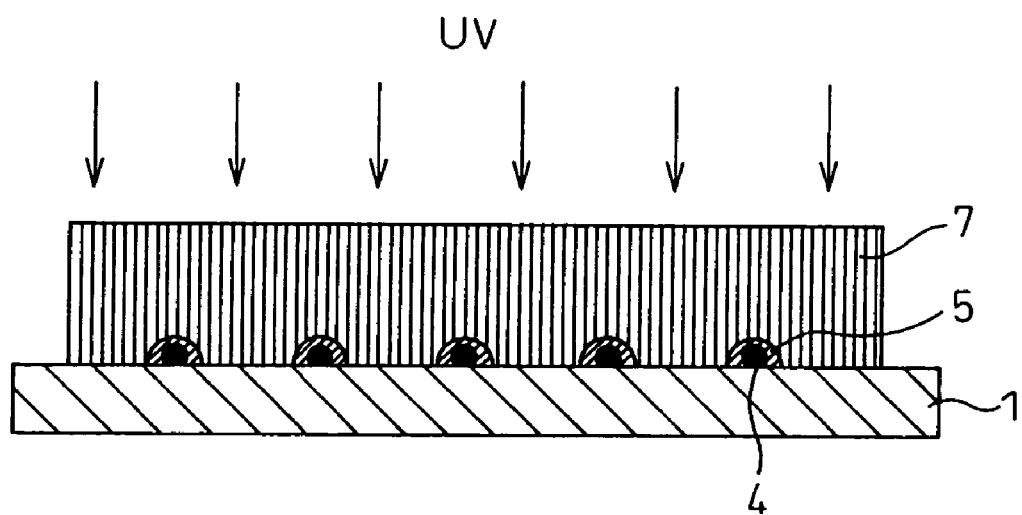
FIG. 3 is a diagram illustrating another embodiment of the method of forming a metal film by irradiating ultraviolet light while the electroless plating is being conducted.

In the step of ultraviolet light irradiation treatment in the method of forming the metal film according to the embodiment described above, the whole surface of the resin substrate 1 has been directly irradiated with ultraviolet light as shown in FIG. 2. It was, however, learned that the adhesion between the resin substrate 1 and the metal film 6 can be further improved if the whole surface of the resin substrate 1 is irradiated with ultraviolet light through a cover glass plate 7 as shown in FIG. 3. When the cover glass plate 7 is placed being intimately adhered onto the surface of the resin substrate 1 as shown, an improved effect is obtained.

The effect obtained by using the cover glass plate is presumably because no air is permitted to exist between the surface of the resin and the cover glass plate that is placed thereon. For reference, even when the surface of the resin substrate 1 is irradiated with the ultraviolet light while interposing pure water between the cover glass plate 7 and the resin substrate 1, no appreciable effect is obtained concerning the adhesion between the resin substrate 1 and the metal film 6.

The foregoing description has dealt with the resin substrate that was chiefly made of the polyimide resin. Not being limited to the polyimide resin only, however, the method of forming the metal film of the embodiment can be further applied to fluorine-contained resins such as epoxy resin and polytetrafluoroethylene, as well as to acrylonitrile/butadiene/styrene resin and polycarbonate resin. If the surface of the resin can be improved and activated by irradiation with ultraviolet light, there is no particular limitation on the material thereof and the adhesion of the metal film can be improved. When the metal film is to be formed on these resin substrates, the wavelength and the dosage of ultraviolet light to be irradiated are suitably selected depending upon the materials, as a matter of course.

The method of forming the metal film according to this embodiment has dealt with the case of forming the metal copper film on the insulating resin layer that is laminated in the semiconductor device. As for the object of the application, however, formation of the metal film is not limited to the semiconductor devices only, but can be applied to the substrates using resins, to the circuit wiring devices using a flexible sheet and to the semiconductor packages using a built-up wiring substrate.

It is further allowable to use other metals such as nickel or chromium instead of copper, as a metal to be electrolytically plated for forming a metal film on the surface of the resin substrate when, for example, corrosion resistance is required.

Concretely described below is a method of forming the metal film according to Examples, i.e., a method of forming the metal copper film on the insulating resin layer made of the polyimide resin laminated in the semiconductor device. Prior to describing Examples, described below, first for reference, are Comparative Examples for demonstrating the effect of the method of forming the metal film of the embodiment.

COMPARATIVE EXAMPLE 1

A metal film in Comparative Example 1 was formed in compliance with the steps of treatment of the method of forming the metal film shown in FIG. 4.

In the step S1 of conditioning treatment, the surface of the polyimide resin was washed by using a conditioning treatment solution of the CONDITIONER NEOPACT U, trade name, supplied by ATOTECH JAPAN K.K. containing a surfactant (containing 30 ml of the undiluted solution per liter of the treatment solution) at 45° C. for 5 minutes. Then, in the next step S2 of pre-dipping treatment, the surface of the polyimide resin was subjected to the treatment for adsorbing the plating nuclei by using a pre-dipping treatment solution of the CATAPREP 404, trade name, supplied by SHIPLEY FAR EAST LTD. containing sodium chloride (NaCL) and sodium hydrogensulfate ($NaHSO_4$)(containing 200 ml of the undiluted solution per liter of the treatment solution) for one minute.

Next, in the step S3 of catalyzing treatment, the catalyzing treatment was conducted by using a mixed treatment solution of the CATAPREP 404, trade name, supplied by SHIPLEY FAR EAST LTD. as a catalyst (containing 250 ml of the undiluted solution per liter of the treatment solution) and the CATAPOSIT 44, trade name, supplied by SHIPLEY FAR EAST LTD. containing palladium chloride ($PdCl_2$) and stannous chloride (containing 33 ml of the undiluted solution per liter of the treatment solution) at 45° C. for 5 minutes to adsorb a complex salt of Pd and Sn. Then, in the step S4 of accelerating treatment, the accelerating treatment was conducted by using the ACCELERATOR 19E, trade name, supplied by SHIPLEY FAR EAST LTD. containing borofluoric acid ($HBF_4$)(containing 40 ml of the undiluted solution per liter of the treatment solution) for 8 minutes so that palladium was precipitated as plating nuclei on the surface of the polyimide resin.

In step S5 of electroless copper plating treatment, the electroless copper plating was conducted by using the CUPOSIT 328, trade name, supplied by SHIPLEY FAR EAST LTD. that is usually used with palladium as a catalyst for 8 minutes to precipitate metal copper maintaining a thickness of 0.1 µm. Here, the CUPOSIT 328 comprises the CUPOSIT 328A containing copper sulfate ($CuSO_4.5H_2O$) (containing 120 ml of the undiluted solution per liter of the treatment solution), the CUPOSIT 328L containing Rochelle salt ($C_4H_4O_6K.Na$) and sodium hydroxide (NaOH)(containing 100 ml of the undiluted solution per liter of the treatment solution) and the CUPOSIT 328C containing formaldehyde (HCHO)(containing 15 ml of the undiluted solution per liter of the treatment solution).

Then, in the step S6 of electrolytic copper plating treatment, the electrolytic copper plating was effected by using the COPPER GLEAM 125, trade name, supplied by MELTEX INC. that is usually used while supplying an electric current in an amount of 2 $A/dm^2$ for 40 minutes to form a metal copper film having a thickness of 18 µm.

As described above, a metal film of copper was formed on an insulating layer using the polyimide resin as a substrate. The adhesion between the polyimide resin and the metal film was measured, and there was exhibited a peeling strength of about 100 gf/cm.

COMPARATIVE EXAMPLE 2

In Comparative Example 2, a metal film was formed in compliance with the steps of treatment of the method of forming the metal film shown in FIG. 6. The method of forming the metal film shown in FIG. 6 simply includes the additional step S0 of ultraviolet light irradiation treatment prior to effecting the steps of treatment in the method of forming the metal film of FIG. 4.

Therefore, the steps S1 to S6 of treatment shown in FIG. 6 are quite the same as the steps S1 to S6 in Comparative Example 1, and are not described here. In the step S0 of ultraviolet light irradiation treatment, however, the surface of the polyimide resin was irradiated with ultraviolet light having a wavelength of 172 nm at an illumination of 13.44 $mW/cm^2$ for 120 seconds. The resin substrate irradiated with the ultraviolet light was subjected to the treatments of the steps S1 to S6, successively.

Thus, a metal film of copper was formed on an insulating layer using the polyimide resin as a substrate. The adhesion between the polyimide resin and the metal film was measured, and there was exhibited a peeling strength of about 122 gf/cm.

EXAMPLE 1

Example 1 deals with a case of forming a metal film of copper on an insulating layer using the polyimide resin as a substrate in compliance with the method of forming a metal film shown in FIG. 1. The method of forming the metal film of FIG. 1 is based on the method of forming a metal film of FIG. 4, but in which the step S5 of the electroless copper plating treatment is replaced by the steps S51 to S54 of the electroless copper plating treatment. Therefore, the step of forming the metal copper film on the surface of the polyimide resin substrate is based on the step of treatment in Comparative Example 1.

In Comparative Examples 1 and 2, the electroless copper plating treatment was conducted for 8 minutes by using the CUPOSIT 328, trade name, supplied by SHIPLEY FAR EAST LTD. In this Example 1, however, the electroless copper plating treatment of Comparative Example 1 was conducted by being divided into two steps, and the surface of the polyimide resin was irradiated with ultraviolet light between the two steps.

In the step S51 of electroless copper plating treatment, the polyimide resin substrate was immersed in an electroless copper plating treatment solution of the CUPOSIT 328, trade name, supplied by SHIPLEY FAR EAST LTD. while using palladium as a catalyst, to conduct the electroless copper plating for 2 minutes. At this time, the thickness of the plated metal copper film was 0.025 µm. Then, the treated sample was taken out from the electroless copper plating treatment solution. In the step S52 of ultraviolet light treatment, the surface of the treated sample was irradiated with ultraviolet light having a wavelength of 172 nm at an illumination of 13.44 $mW/cm^2$ for 120 seconds.

Then, in the step S53 of treatment with acid, the sample was treated with a treatment solution containing 10% of sulfuric acid for 10 seconds to clean the surface of the metal copper on which the plating nuclei of palladium has been adhered as a catalyst. In the step S54 of the electroless copper plating treatment, the treated sample irradiated with ultraviolet light was immersed again in the above-mentioned electroless copper plating treatment solution in order to effect the additional electroless copper plating. The electroless copper plating treatment was conducted for 6 minutes to form a film of metal copper maintaining a thickness of 0.075 µm.

Then, as in Comparative Example 1, the electrolytic copper plating was conducted in the step S6 of electrolytic copper plating treatment by using the COPPER GLEAM 125, trade name, supplied by MELTEX INC., while flowing a current in an amount of 2 $A/dm^2$ for 40 minutes to form a metal copper film having a thickness of 18 µm.

Thus, a metal film of copper was formed on an insulating layer using the polyimide resin as a substrate. The adhesion between the polyimide resin and the metal film was measured, and there was exhibited a peeling strength of 484 gf/cm which was large enough for practical use.

EXAMPLE 2

Example 2 deals with a case of irradiating the ultraviolet light through a cover glass plate, as shown in FIG. 3, in the step S52 of ultraviolet light irradiation treatment in Example 1 which complies with the method of forming a metal film illustrated in FIG. 1. Therefore, the method of forming a metal film of Example 2 is based on quite the same steps of treatment with the exception of using the cover glass plate at the time of irradiation with ultraviolet light.

Thus, a metal film of copper was formed on an insulating layer using the polyimide resin as a substrate. The adhesion between the polyimide resin and the metal film was measured, and there was exhibited a peeling strength of 728 gf/cm which was large enough for practical use.

According to the method of forming a metal film of Example 1 or 2, the surface of the resin substrate is irradiated with an ultraviolet light when there exist, in a mixed manner, portions exposing the surface of the resin substrate and the metal copper film formed by the electroless copper plating, or during the electroless plating treatment. Therefore, there is obtained an adhesion much larger than that of the metal film formed by the conventional methods of forming the metal film of Comparative Examples 1 and 2 and, hence, the adhesion is improved.

According to the method of forming a metal film of the present invention as described above, the resin substrate is treated with the ultraviolet light at a timing when there exist, in a mixed manner, portions exposing the surface of the resin substrate and the metal copper film formed by the electroless copper plating, or during the electroless plating treatment. Namely, the irradiation with an ultraviolet light improves the adhesion between the surface of the resin and the precipitated metal and, hence, the adhesion is improved to a degree sufficient for the metal film even by omitting the etching treatment, on the surface of the resin, that has been customarily done.

Without using the etching treatment solution, further, it becomes easy to cope with the danger and the public hazard and to decrease the burden of handling, treatment of drained solution and amount of work.

According to the method of forming a metal film of the present invention, further, the timing for irradiating ultraviolet light is contrived to improve the adhesion between the resin substrate and the metal film, and there is no need of providing a treatment agent for promoting the reforming of the surface of the resin substrate separately from the treatment solutions used in the ordinary steps of treatment. The number of the steps of treatment is decreased by an amount equal to omitting the etching treatment, and the cost of treatment can be decreased, correspondingly.

As for reforming the surface of the resin substrate, what is necessary is simply to vary the time of irradiating ultraviolet light without requiring any particular treatment apparatus but the ultraviolet light irradiator. Besides, the customarily used treatment solution can be used without increasing the cost related to the facilities, and the products can be inexpensively provided.

The method of forming a metal film on the surface of the resin substrate of the invention can be applied to forming a metal film on the laminated insulating layer in the semiconductor devices. Further, the metal film can be easily formed even on a resin substrate and a flexible sheet, to inexpensively provide the products.

What is claimed is:

1. A method of forming a metal film on a resin substrate surface, comprising, in succession:
    forming plating nuclei on said resin substrate surface;
    electroless plating said plating nuclei with a metal covering said plating nuclei, as a first surface, portions of the resin substrate surface remaining exposed, as a second surface;
    after said electroless plating, irradiating both said first surface and said second surface with ultraviolet light; and
    electrolytic plating metal on said first and second surfaces to form a continuous metal film surface.

2. A method of forming a metal film according to claim 1, wherein further electroless plating is effected on said first and second surfaces after said irradiating with ultraviolet light and before said electrolytic plating.

3. A method of forming a metal film according to claim 1, wherein said ultraviolet light is irradiated through a glass board placed on said resin substrate surface.

4. A method of forming a metal film according to claim 3, wherein the metal formed by said electroless plating is a selected one of copper and nickel.

* * * * *